(12) United States Patent
Hutchison et al.

(10) Patent No.: US 6,611,426 B2
(45) Date of Patent: *Aug. 26, 2003

(54) TELECOMMUNICATIONS ENCLOSURE WITH INDIVIDUAL, SEPARATED CARD HOLDERS

(75) Inventors: Randall D. Hutchison, Shawnee, KS (US); Tomasz Taubert, Leawood, KS (US)

(73) Assignee: Special Products Company, Overland Park, KS (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/127,222

(22) Filed: Apr. 22, 2002

(65) Prior Publication Data

US 2002/0118510 A1 Aug. 29, 2002

Related U.S. Application Data

(63) Continuation of application No. 09/781,178, filed on Feb. 12, 2001, now Pat. No. 6,430,044.
(60) Provisional application No. 60/181,609, filed on Feb. 10, 2000.

(51) Int. Cl.$^7$ ................................................. H05K 7/20
(52) U.S. Cl. .......................... 361/690; 361/721; 455/90
(58) Field of Search ................................. 361/690, 692, 361/688, 703, 704, 707, 729, 715–721, 752, 825, 797, 831; 439/61, 607, 485; 455/90, 128, 347–349; 454/184; 165/80.3, 185; 174/52.1, 59

(56) References Cited

U.S. PATENT DOCUMENTS

| | | | |
|---|---|---|---|
| 4,449,576 A | | 5/1984 | Baum et al. |
| 4,465,899 A | * | 8/1984 | Mauclere et al. ........... 174/52.1 |
| 4,528,615 A | | 7/1985 | Perry |
| 4,679,250 A | | 7/1987 | Davis et al. |
| 4,858,068 A | | 8/1989 | Bitller et al. |
| 4,962,445 A | | 10/1990 | Pelet et al. |
| 5,060,115 A | | 10/1991 | Sewell |
| 5,105,337 A | | 4/1992 | Bitller et al. |
| 5,251,099 A | | 10/1993 | Goss et al. |

(List continued on next page.)

FOREIGN PATENT DOCUMENTS

| | | | |
|---|---|---|---|
| DE | 298610 | 5/1972 | |
| DE | 2538440 | 3/1977 | ............ F16J/13/02 |
| FR | 2080839 | 11/1971 | ............ F28F/9/00 |
| GB | 2193552 | 2/1988 | ............ H04B/9/00 |
| JP | 57102058 | 6/1982 | ............ H01L/23/34 |
| JP | 6079834 | 5/1985 | ............ H04B/3/02 |
| JP | 865868 | 3/1996 | ............ H02G/9/02 |
| WO | WO 0017581 | 3/2000 | ............ F24D/19/02 |

OTHER PUBLICATIONS

Thermacore Inc. sales brochure, "heat pipes for electronics cooling applications", 4 page.
Thermacore Inc. Product Data Guide, "Miniature Heat Pipes," Sep. 24, 1996, 1 page.
Thermacore Inc. brochure, "Common Questions About Heath Pipes," Sep. 23, 1996, 2 pages.
Thermacore Inc. sales brochure, "The Leader in Heath Pipe Technology", 4 pages.

Primary Examiner—Gerald Tolin
(74) Attorney, Agent, or Firm—Hovey Williams LLP

(57) ABSTRACT

A telecommunications equipment enclosure (10) that more effectively dissipates heat from electronic cards without transferring the heat to adjacent cards and without transferring the heat to air within an enclosed chamber surrounding the cards. The enclosure (10) includes a floor (12) and a plurality of card-receiving sleeves (14) attached to the floor (12). Each of the sleeves (14) defines a separate enclosed cell or holder that is configured for receiving and enclosing a single electronic card. The sleeves (14) are spaced apart to define a plurality of open air channels therebetween for convecting heat away from the sleeves (14) and the cards received therein while preventing heat from transferring from sleeve to sleeve.

11 Claims, 7 Drawing Sheets

U.S. PATENT DOCUMENTS

| | | | |
|---|---|---|---|
| 5,329,425 A | | 7/1994 | Leyssens et al. |
| 5,343,358 A | | 8/1994 | Hilbrink |
| 5,777,846 A | * | 7/1998 | Hayes et al. ................. 361/690 |
| 5,842,514 A | * | 12/1998 | Zapach et al. ......... 165/104.33 |
| 5,844,777 A | | 12/1998 | Gates |
| 5,883,784 A | | 3/1999 | Hughes et al. |
| 5,896,268 A | * | 4/1999 | Beavers ...................... 361/690 |
| 5,930,113 A | | 7/1999 | McCann |
| 5,943,219 A | | 8/1999 | Bellino et al. |
| 5,949,650 A | | 9/1999 | Bulante et al. |
| 6,025,991 A | | 2/2000 | Saito |
| 6,028,769 A | | 2/2000 | Zurek |
| 6,046,908 A | | 4/2000 | Feng |
| 6,055,157 A | | 4/2000 | Bartilson |
| 6,104,611 A | | 8/2000 | Glover et al. |
| 6,118,662 A | * | 9/2000 | Hutchison et al. .......... 361/704 |
| 6,244,332 B1 | | 6/2001 | Gesklin et al. |
| 6,252,775 B1 | | 6/2001 | Kuroda |
| 6,292,556 B1 | | 9/2001 | Laetsch |
| 6,310,772 B1 | * | 10/2001 | Hutchison et al. .......... 361/700 |
| 6,396,691 B1 | * | 5/2002 | Pagnozzi .................... 361/690 |
| 6,404,637 B2 | * | 6/2002 | Hutchison et al. .......... 361/704 |
| 6,430,044 B2 | * | 8/2002 | Hutchison et al. |

\* cited by examiner

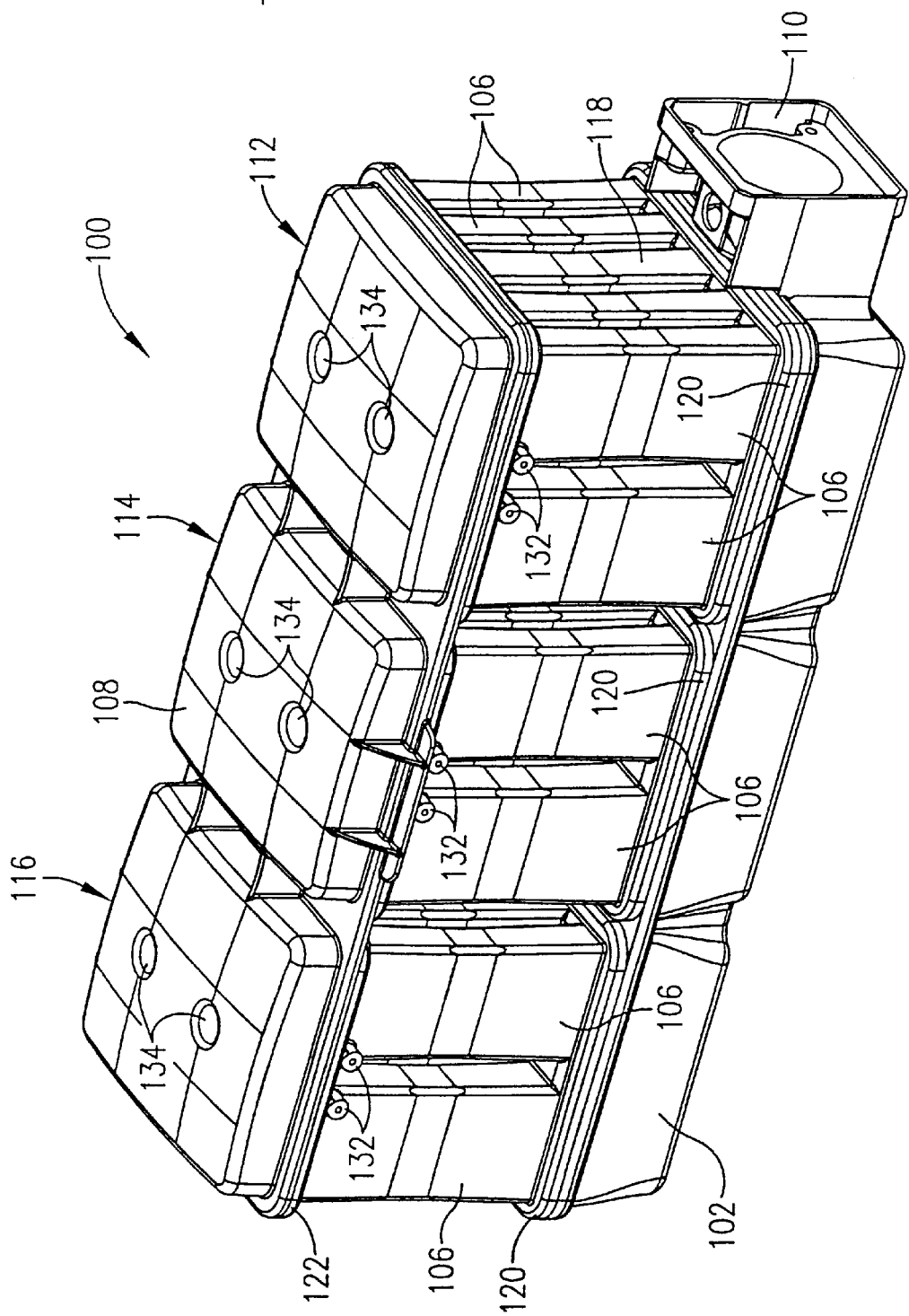

TELECOMMUNICATIONS ENCLOSURE WITH INDIVIDUAL, SEPARATED CARD HOLDERS

RELATED APPLICATIONS

This application is a continuation and claims priority benefit of a non-provisional patent application titled "Telecommunications Enclosure With Individual Separated Card Holders", Ser. No. 09/781,178, Filed Feb. 12, 2201, now U.S. Pat. No. 6,430,044, which claims to benefit of provisional application Ser. No. 60/181,609, filed Feb. 10, 2000, which is incorporated into the present application. by reference.

BACKGROUND OF THE INVENTION

1. Field of the Invention

The present invention relates to enclosures for protecting electronic cards such as telecommunications repeaters from exposure to harmful elements and for dissipating heat from the cards. More particularly, the invention relates to such an enclosure that permits heat to be conducted and convected from individual cards without transferring the heat to adjacent cards or to air in an enclosed chamber surrounding the cards.

2. Description of the Prior Art

Electronic cards such as telecommunications repeaters and other electronic equipment used in ISDN, (X)DSL, and T1 communications services are typically housed in enclosures that are mounted to telephone poles or placed next to buildings or in manholes. The enclosures must be designed to protect the cards from natural elements such as sun, rain, snow, and fire, as well as damage from vandalism and attempted theft. Just as importantly, the enclosures must be designed to dissipate excess heat generated by the cards.

One problem with prior art telecommunications enclosures is that heat generated from cards housed therein is transferred to other cards before it can be dissipated from the enclosure. This is because prior art enclosures typically include a plurality of card-receiving sleeves that are mounted side-by-side in a single, enclosed compartment. The cards therefore transfer heat to one another and convect heat to the air in the enclosed compartment. The heated air in turn tends to transfer heat back to the sleeves, or at least reduces the rate of heat transfer from the sleeves to the air.

Another problem with prior art telecommunications enclosures is that they are large, bulky, and heavy and therefore difficult to maneuver and install in manholes and other structures where space is limited. A related problem is that prior art telecommunications enclosures must be manually held in place against a wall or other surface while it is being bolted or otherwise fastened thereto. Because of the excessive weight of prior art enclosures, this procedure is difficult and typically requires at least two persons to accomplish.

Accordingly, there is a need for an improved enclosure for telecommunications equipment that overcomes the limitations of the prior art.

SUMMARY OF THE INVENTION

The present invention solves the above-described problems and provides a distinct advance in the art of enclosures for telecommunications equipment. More particularly, the present invention provides a telecommunications equipment enclosure that more effectively dissipates heat from electronic cards without transferring the heat to adjacent cards. The enclosure has no common, enclosed chamber surrounding the cards; therefore, the cards do not transfer heat to such an enclosed chamber. The telecommunications enclosure of the present invention achieves the foregoing while maintaining a relatively small "footprint" (per card density) so that it can be easily maneuvered and installed even in cramped locations such as manholes. The enclosure also includes novel mounting structure that permits it to be more easily mounted in a manhole or other structure by a single person.

One embodiment of the present invention broadly includes a floor and a plurality of card-receiving sleeves attached to the floor. Each of the sleeves defines a separate enclosed cell or holder that is configured for receiving and enclosing a single electronic card. The sleeves are attached to and spaced apart along the floor to define a plurality of open air channels therebetween for convecting heat away from the sleeves and the cards received therein while preventing heat from transferring from card to card. Because each sleeve serves as a separate enclosed cell or card holder, a larger chamber or enclosure for surrounding the sleeves is not required. Thus, heat that is convected from the sleeves is transferred directly to ambient air surrounding the sleeves and not to an enclosed chamber surrounding the sleeves. The elimination of a larger chamber or enclosure that surrounds the sleeves also reduces the overall size and weight of the enclosure so that it can be more easily maneuvered and installed.

These and other important aspects of the present invention are described more fully in the detailed description below.

BRIEF DESCRIPTION OF THE DRAWING FIGURES

A preferred embodiment of the present invention is described in detail below with reference to the attached drawing figures, wherein:

FIG. 5 is an isometric view of a telecommunications enclosure constructed in accordance with a second preferred embodiment of the present invention;

Figure 1:
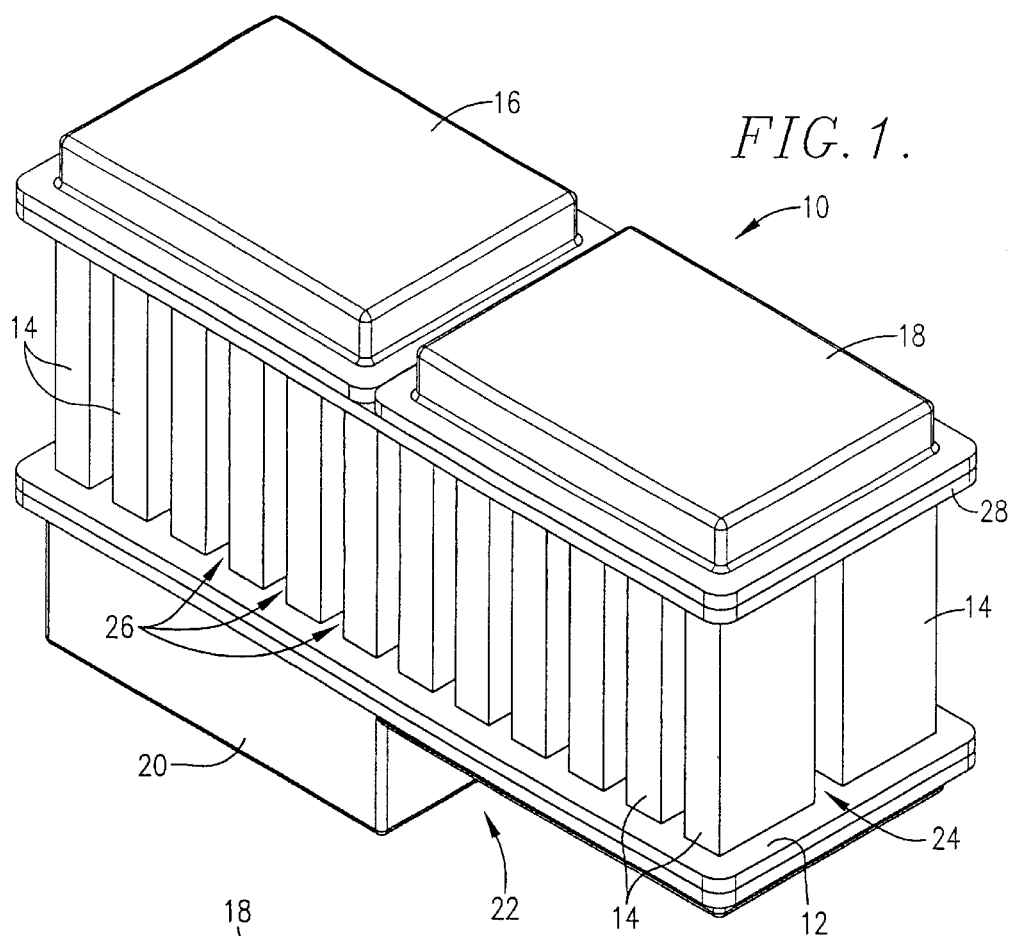
FIG. 1 is an isometric view of a telecommunications enclosure constructed in accordance with a first preferred embodiment of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENTS

Referring to the drawings figures, a telecommunications enclosure 10 constructed in accordance with a first preferred embodiment of the invention is illustrated in FIGS. 1–4. The telecommunications enclosure 10 is provided for housing electronic cards such as telecommunications repeater and doubler cards.

The enclosure 10 broadly includes a floor 12, a plurality of card-receiving sleeves 14 mounted to the floor, and a pair of lids 16, 18 for providing access to and covering the sleeves 14. The enclosure 10 may be formed of any suitable material but is preferably injection molded of thermally conductive polymer composite materials or of die-cast metal materials, preferably aluminum alloy, having a high thermal conductivity rating and high corrosion resistance.

In more detail, the floor 12 supports the sleeves 14 as illustrated and is preferably rectangular in shape. A printed circuit board having a plurality of connectors mounted thereon may be positioned between the floor 12 and a base 20 for making electrical contact with corresponding connectors on the cards placed within the sleeves 14.

The floor 12 is preferably mounted to a hollow base 20 that serves as a support for the floor 12 and as a conduit or cable tray for routing cables that are wired to the cards housed within the sleeves 14. The outside surface of the sleeve may be smooth as shown or the surface area may be increased for improved heat dissipation. For example, fins could be added into the outside surface of the sleeve. The base 20 does not extend the entire length of the floor 12 so as to present an open area 22 beneath a portion of the floor for receiving the cabling. In an alternative embodiment, the base 20 may be replaced with an adaptor plate that is dimensioned to fit an existing industry standard splice box such as the Western Electric 819 splice box.

The sleeves 14 are supported by and extend upwardly from the floor 12 and are each configured for receiving and enclosing one electronic card. The sleeves 14 are preferably generally rectangular in cross-section and may be designed to house either single-wide or double-wide repeater cards. Each sleeve 14 has a pair of spaced-apart side walls, a pair of spaced-apart end walls, an open bottom connected to the floor 12, and an open top for receiving an electronic card. Each sleeve 14 is sized so that a card positioned therein will reside in close proximity or preferably firmly contact the inner walls of the sleeve 14 to encourage conduction of heat generated from the card to the inner walls.

The sleeves 14 are preferably positioned on the floor 12 in a spaced, rectangular array of two rows, with twelve sleeves in each row, for a total of twenty-four sleeves. However, the enclosure 10 may be provided with any number of rows and/or sleeves 14 as a matter of design choice without departing from the scope of the present invention.

Figure 4:
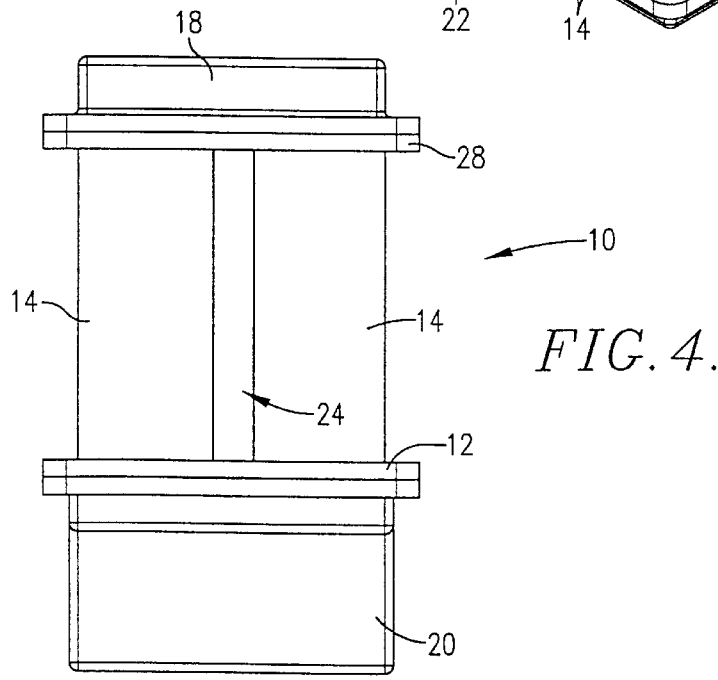
FIG. 4 is an end view of the enclosure taken from the right side of FIG. 1.
Figure 3:
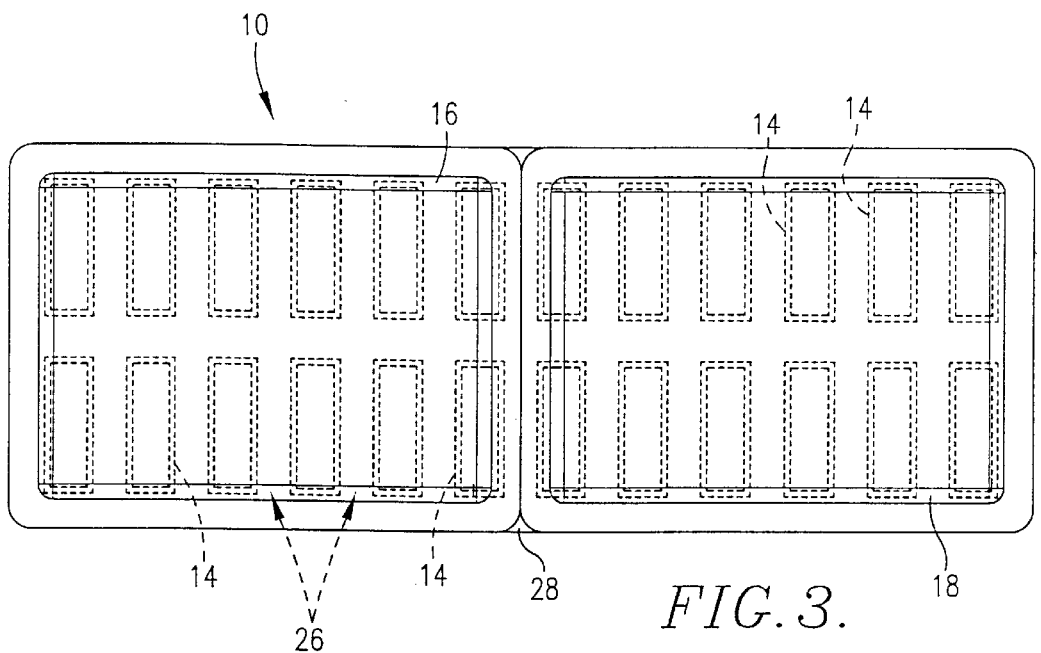
FIG. 3 is a top view of the enclosure with its lids removed.
Figure 2:
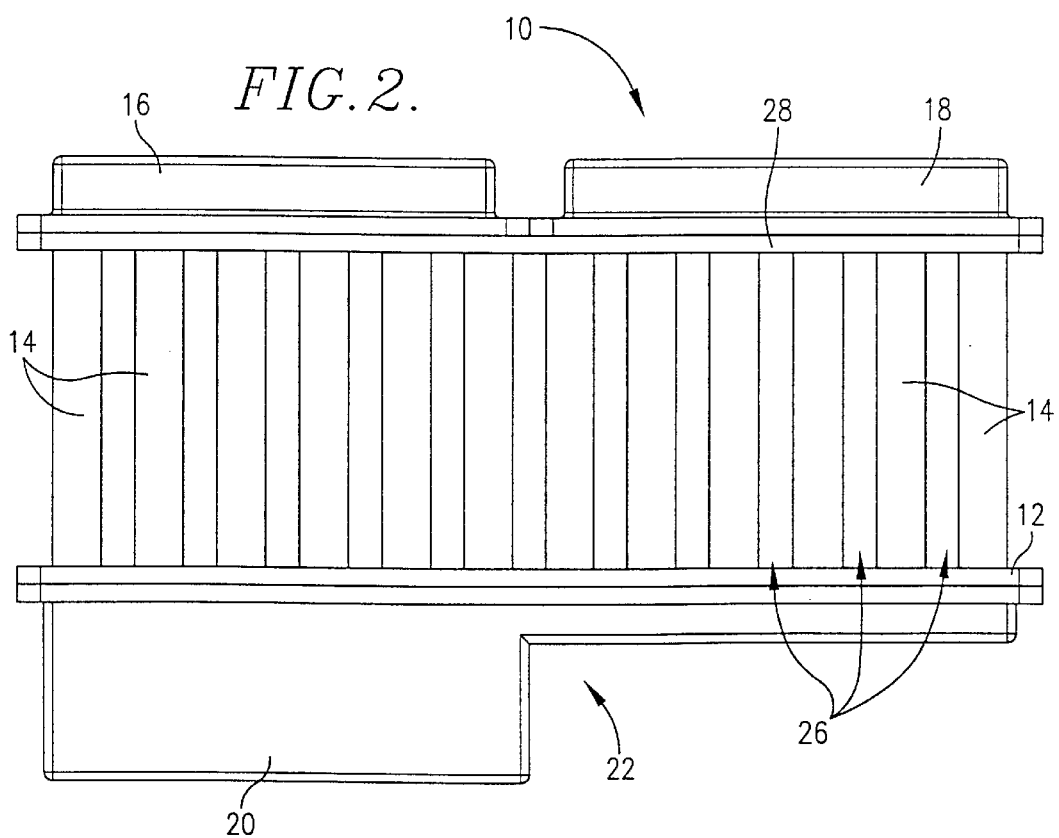
FIG. 2 is a side elevational view of the enclosure of FIG. 1.

As best illustrated in FIGS. 1 and 4, the rows of sleeves 14 are spaced apart to define a central, longitudinally-extending air channel or open space 24 between the rows. As best illustrated in FIGS. 1 and 3, the sleeves 14 within each row are also spaced apart to define a plurality of transversely-extending air channels or open areas 26 between the sleeves. The longitudinally-extending air channels 24 and the transversely-extending air channels 26 form a grid of air passageways that permit ambient air to pass by the side walls and end walls of all of the sleeves 14. The ambient air convects heat from the sleeves 14 so that heat is not transferred from sleeve to sleeve or to an enclosed chamber surrounding the sleeves 14 as with prior art enclosures.

The lids 16, 18 provide access to the cards when open and cover the open tops of the sleeves 14 to protect the repeater cards from water and other elements when closed. The lids 16, 18 are preferably hingedly mounted to a flange 28, which is in turn attached to the open tops of the sleeves 14. The lids 16, 18 may also be provided with locks or other fasteners to prevent unauthorized access to the cards within the enclosure 10.

FIGS. 5–9 illustrate a telecommunications enclosure 100 constructed in accordance with a second preferred embodiment of the present invention. The enclosure 100 broadly includes a hollow base 102, floors 120 mounted to the base 102 and a plurality of card-receiving sleeves 106 mounted to the floors 120, and a lid 108 that provides access to the cards and covers the open ends of the sleeves 106. The enclosure 100 may be constructed of any suitable materials but is preferably formed primarily of injection-molded, thermally-conductive polymer composite materials or die-cast metal materials, preferably aluminum alloy, having a high thermal conductivity rating.

In more detail, the base 102 is provided for routing cabling to the cards housed in the enclosure 100. A wiring fastener or interface connector 110 is preferably mounted to the base 102 to allow cabling to be quickly connected and/or disconnected from the enclosure 100. The interface connector 110 is disclosed in more detail in provisional patent application entitled "Segmented Telecommunications Enclosure," Serial No. 60/221,234, filed Jul. 27, 2000, hereby incorporated into the present application by reference.

Each floor 120 is preferably rectangular in shape and is mounted to the base 102 for supporting the card-receiving sleeves 106. A printed circuit board having a plurality of connectors mounted thereon is positioned between the floors 120 and the base 102 for making electrical contact with corresponding card edges or connectors on the electronic cards placed in the sleeves 106.

The sleeves 106 are supported by and extend outwardly from the floors 120 and are each configured to house a single electronic card 107 such as a single-wide or a double-wide repeater card. Each sleeve 106 is preferably rectangular in cross section and includes a pair of spaced-apart side walls, a pair or spaced apart end walls, an open bottom connected to the floors 120, and an open top that together form a separate cell or card holder for receiving an electronic card 107. Each sleeve 106 is sized so that an electronic card 107 positioned therein will reside in close proximity or preferably firmly contact the inner walls of the sleeve 106 to encourage conduction of heat generated from the cards to the walls. Biasing mechanisms such as leaf springs may be positioned within each sleeve 106 for firmly biasing the electronic cards 107 against the inner walls of the sleeve 106 to improve conduction of heat from the cards 107 to the sleeves 106.

The number of cards 107 that must be housed in a protective enclosure varies from application to application.

Therefore, the enclosure 100 is preferably formed in sections or modules, each containing a plurality of individual sleeves 106, so that any number of modules may be coupled together to hold any desired number of cards 107. For example, the preferred enclosure illustrated in FIGS. 5–9 includes three sleeve modules 112,114,116; however, any number of sleeve modules may be provided as a matter of design choice.

Each sleeve module 112, 114, 116 preferably includes four rows of card-receiving sleeves 106. Each module also includes a row of protection card-receiving chambers 118 between the rows of card-receiving sleeves 106. Each row of sleeves 106 and chambers 118 includes two individual sleeves or chambers. Thus, each sleeve module 112, 114,116 preferably includes a total of eight card-receiving sleeves 106 and two protection card-receiving chambers 118.

Protection cards 119 inserted in the chambers 118 protect the electronic cards 107 received within the sleeves 106 from power surges caused by lightning and other disturbances. The protection cards 119 and their associated test pins may be inserted and removed from the chambers 118 independently without first disconnecting the cards 107 positioned in the sleeves 106. This allows the protection cards 119 to be quickly and easily serviced without disrupting the function of the cards 107 positioned within the sleeves 106.

Figure 7:
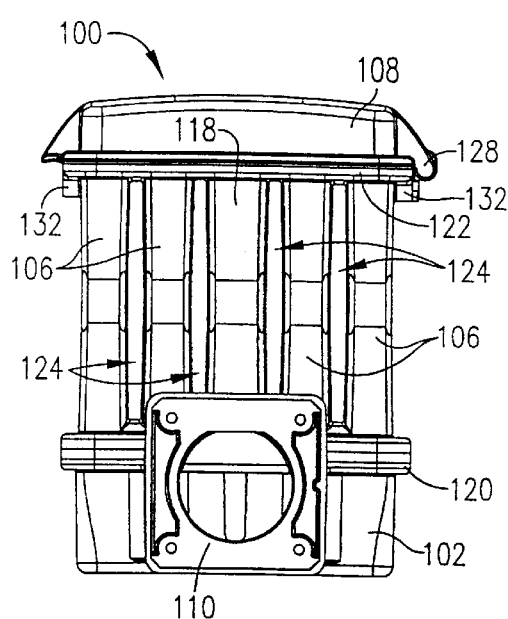
FIG. 7 is an end view of the enclosure taken from the right side of FIG. 5.
Figure 8:
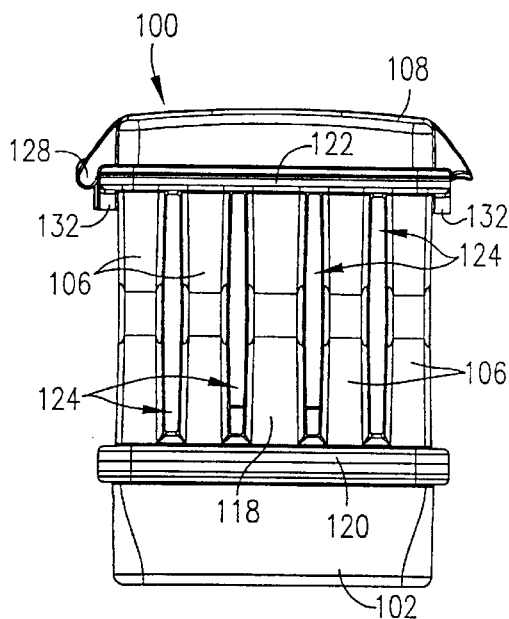
FIG. 8 is an end view of the enclosure taken from the left side of FIG. 5.

Each sleeve module 112, 114, 116 includes one of the floors 120 attached to the open bottoms of the sleeves 106 and a top flange 122 attached to the open tops of the sleeves 106. The floors 120 and top flanges 122 protect the cards 107 received within the sleeves 106 in case the enclosure 100 is dropped or struck When the enclosure 100 is provided with two or more sleeve modules 112, 114, 116 as illustrated, the modules 112, 114, 116 are aligned on the base 102 so that the four spaced-apart rows of sleeves 106 and the single row of protection card chambers 118 are in alignment along the length of the enclosure 100. As best illustrated in FIGS. 7 and 8, the aligned rows of sleeves 106 and protection card chambers 118 define a plurality of longitudinally-extending air channels 124 that extend the entire length of the enclosure 100.

Figure 9:
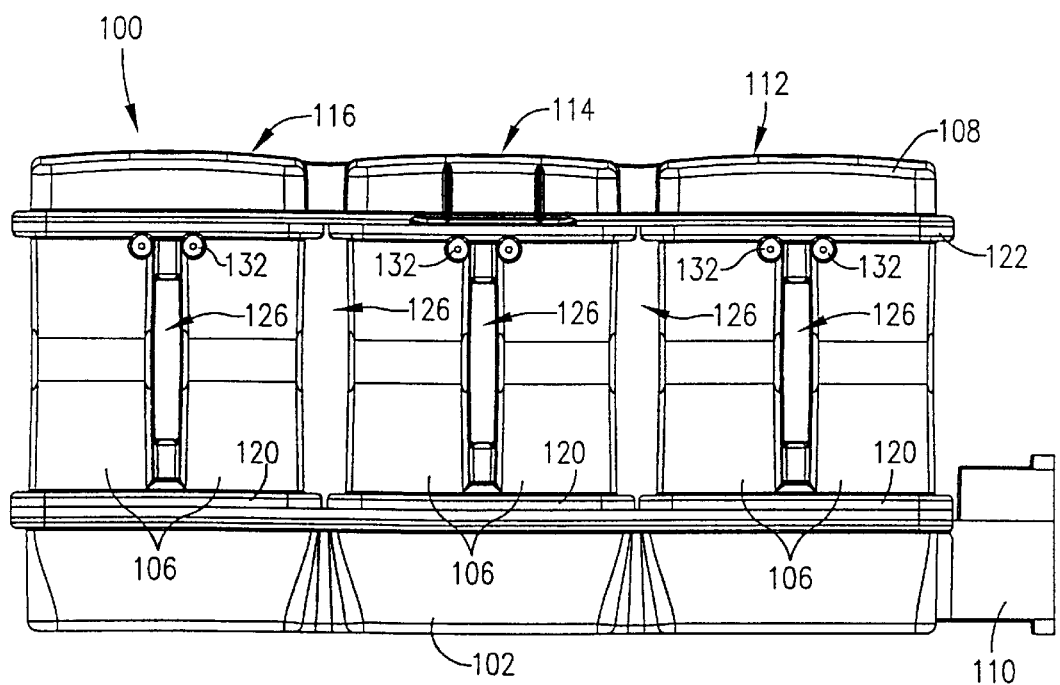
FIG. 9 is a side elevational view of the enclosure of FIG. 5.

When three sleeve modules 112,114, 116 are mounted to the base 102 as illustrated, the aligned rows of sleeves each include six spaced-apart sleeves 106 that define a plurality of transversely-extending air channels 126 therebetween that intersect the longitudinally-extending air channels 124 as best illustrated in FIG. 9. The air channels 124, 126 form a grid of air passageways that permit ambient air to pass by the side walls and the end walls of all of the sleeves 106 and the protection card chambers 118. Ambient air in the air channels 124, 126 convect heat from the sleeves 106 and the protection card chambers 118 so that heat is not transferred from sleeve to sleeve or to ambient air in an enclosed chamber as with prior art telecommunications enclosures.

Figure 6:
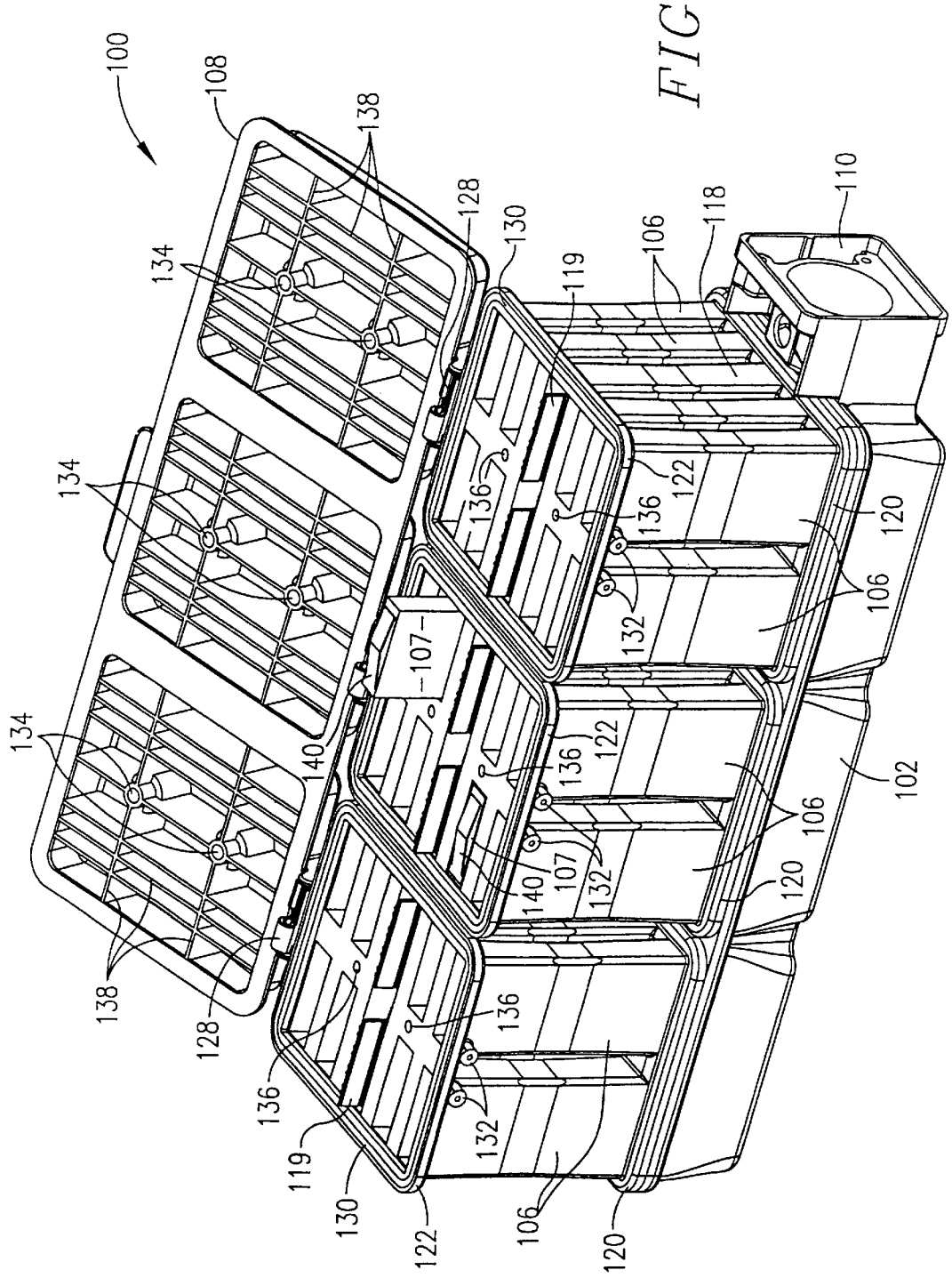
FIG. 6 is an isometric view of the enclosure of FIG. 5 shown with its lid open.
Figure 11:
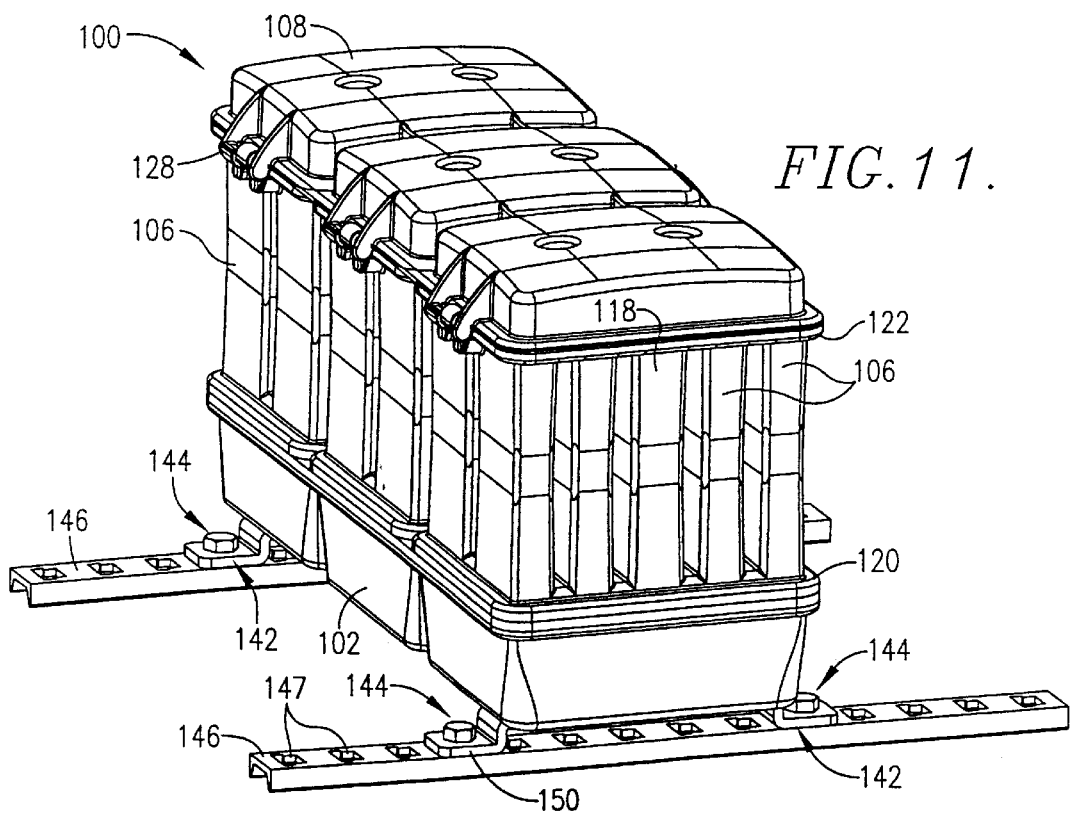
FIG. 11 is a three-dimensional view of the enclosure of FIG. 5 showing its attachment structure engaged to a pair of spaced-apart rails.

As best illustrated in FIGS. 6 and 11, the lid 108 is attached to the top flanges 122 of the sleeve modules 112, 114, 116 by a plurality of "floating" hinges 128. Compressible gaskets 130 are preferably positioned between the lid 108 and the top flanges 122 to provide a seal therebetween when the lid 108 is closed. The hinges 128 retain the lid 108 on the sleeve modules 112, 114, 116 but do not compress the gaskets 130 when the lid 108 is closed. The hinges 128 may be mounted to internally threaded posts 132 on either side of the enclosure 100 making the door swing reversible with screws or other fasteners and may be quickly disconnected therefrom by simply removing the screws.

The lid 108 includes a plurality of tubular bores 134 that are in alignment (when the lid 108 is closed) with a plurality of internally-threaded screw holes 136 formed in the top flanges 122 of the sleeve modules 112, 114, 116 as illustrated in FIG. 6. Screws, bolts, or other fasteners may be inserted through the tubular bores 134 and threaded into the holes 136 to securely fasten the lid 108 to the sleeve modules 112, 114, 116 and to compress the gaskets 130 between the lid 108 and the top flange 122. Because the gaskets 130 are compressed by the fasteners extending through the bores 134 and into the holes 136, but not the hinges 128, a more uniform seal may be established around the entire perimeter of the lid 108.

As best illustrated in FIG. 6, the inside face of the lid 108 includes a plurality of intersecting ribs 138 that increase the rigidity and strength of the lid 108. The ribs 138 also serve to bias the electronic cards 107 into the sleeves 106 when the lid 108 is closed. Biasing mechanisms 140 such as leaf springs may be mounted to the tops of the cards and compressed by the ribs 138 when the lid 108 is closed to further facilitate biasing of the cards into the sleeves 106.

Figure 10:
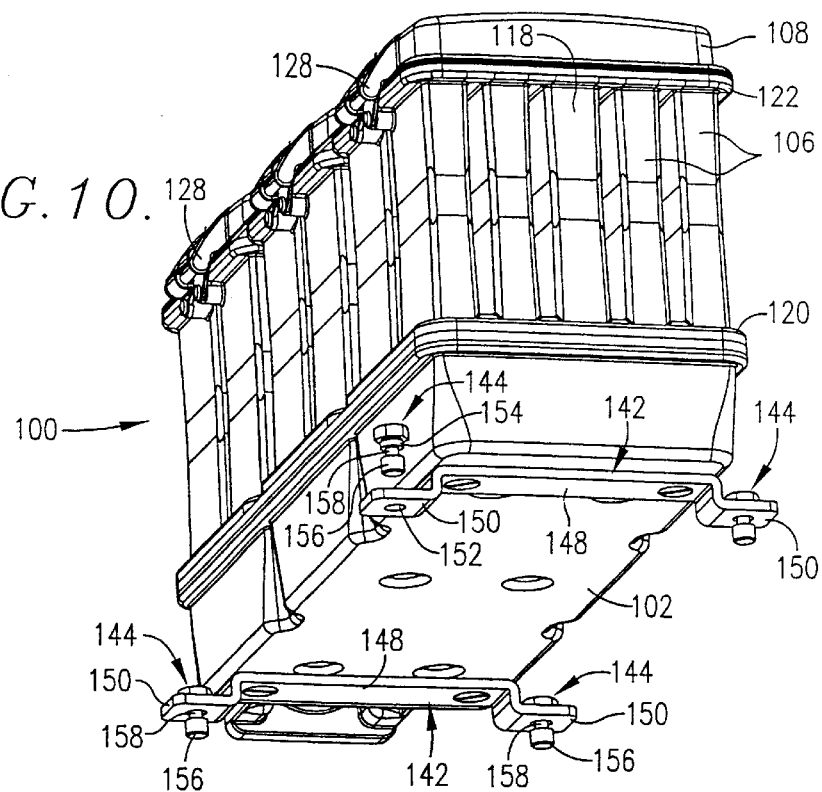
FIG. 10 is a three-dimensional view of the enclosure of FIG. 5 illustrating attachment structure connected to the enclosure.
Figure 12:
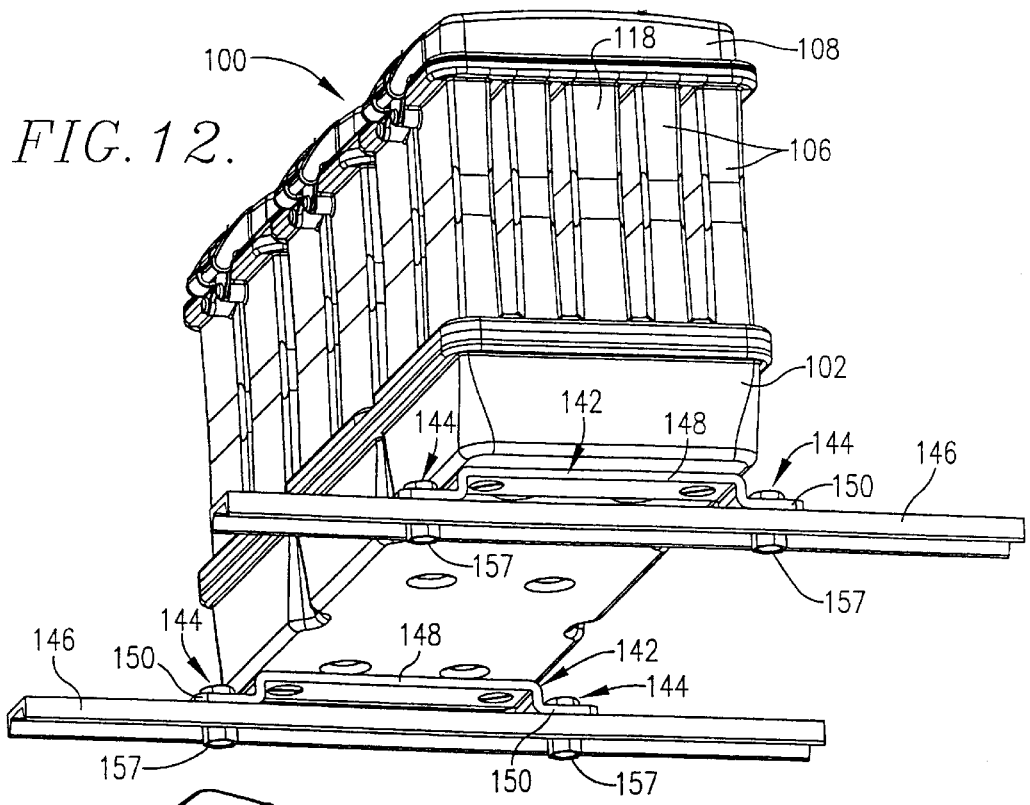
FIG. 12 is a three-dimensional view that it is taken from the rear side of the rails showing the attachment structure secured to the rails.

Enclosures such as the ones disclosed in the present application are typically bolted or otherwise fastened to a wall or other structure. To do so, the enclosures must be manually held in place while they are being attached to the wall or other structure. Those skilled in the art will appreciate that this operation is very difficult, especially in manholes, and typically requires at least two persons to perform. FIGS. 10–12 illustrate a novel mounting structure that permits an installer to more easily mount the enclosure 100 to a wall or other surface of a manhole or other structure. As best illustrated in FIGS. 10 and 11, the mounting structure includes a pair of mounting brackets 142, a plurality of specially-designed bolts 144, and a pair of elongated mounting rails 146. The mounting brackets 142 are somewhat U-shaped and each present an elongated bight section 148 and a pair of depending spaced-apart legs 150. The bight section 148 is bolted or otherwise fastened to the bottom of the enclosure base 102. The legs 150 extend outwardly from the enclosure base 102 and each includes an internally-threaded, fastener-receiving opening 152.

The bolts 144 each include a pair of spaced-apart, threaded sections 154, 156 separated by a reduced diameter groove 158. The threaded sections 154, 156 have a diameter approximately equal to the diameter of the fastener-receiving openings 152 and the groove 158 has a reduced diameter. One bolt 144 is threaded through each of the fastener-receiving openings 152 in the bracket legs 150 so that the first threaded section 154 is threaded within the opening and the second threaded section 156 and reduced diameter groove 158 extend from the back side of the brackets 142.

The mounting rails 146 are generally U-shaped in cross section and each include a plurality of longitudinally-spaced T-shaped mounting slots 147. Each of the slots 147 includes an enlarged upper area (top of the T) and a relatively smaller width lower area (bottom of the T).

The rails 146 are bolted or otherwise secured to a standoff bracket (not shown) which is in turn bolted or otherwise secured to a wall or surface of a manhole or other structure as illustrated in FIGS. 11 and 12. The rails can be mounted either vertically or horizontally. For vertical mounting, the enclosure 100 with brackets 142 and bolts 144 fixed thereto may be mounted to the rails 146 by inserting the protruding ends of the bolts 144 into the upper areas of four of the T-slots and then lowering the enclosure 100 until the grooves of the bolts 144 rest in the lower sections of the T-slots. At this point, the threaded sections 156 of the bolts 144 extend through the back side of the rails 146 so that they can receive nuts 157 as illustrated in FIG. 12 to securely fasten the enclosure 100 to the rails 146.

The above-described mounting procedure allows a single installer to maneuver the enclosure 100 into a manhole or other structure and then mount the enclosure to rails on the wall of the manhole without having to support the weight of the enclosure while securing it to the rails. This significantly simplifies and eases the installation of the enclosure and reduces operator strain and injury.

This mounting configuration orients the cards 107 in the enclosure 100 horizontally for optimal heat transfer from the cards 107 and sleeves 106. However, the enclosure 100 may also be mounted so that the cards 107 are oriented vertically or at an angle.

Figure 13:
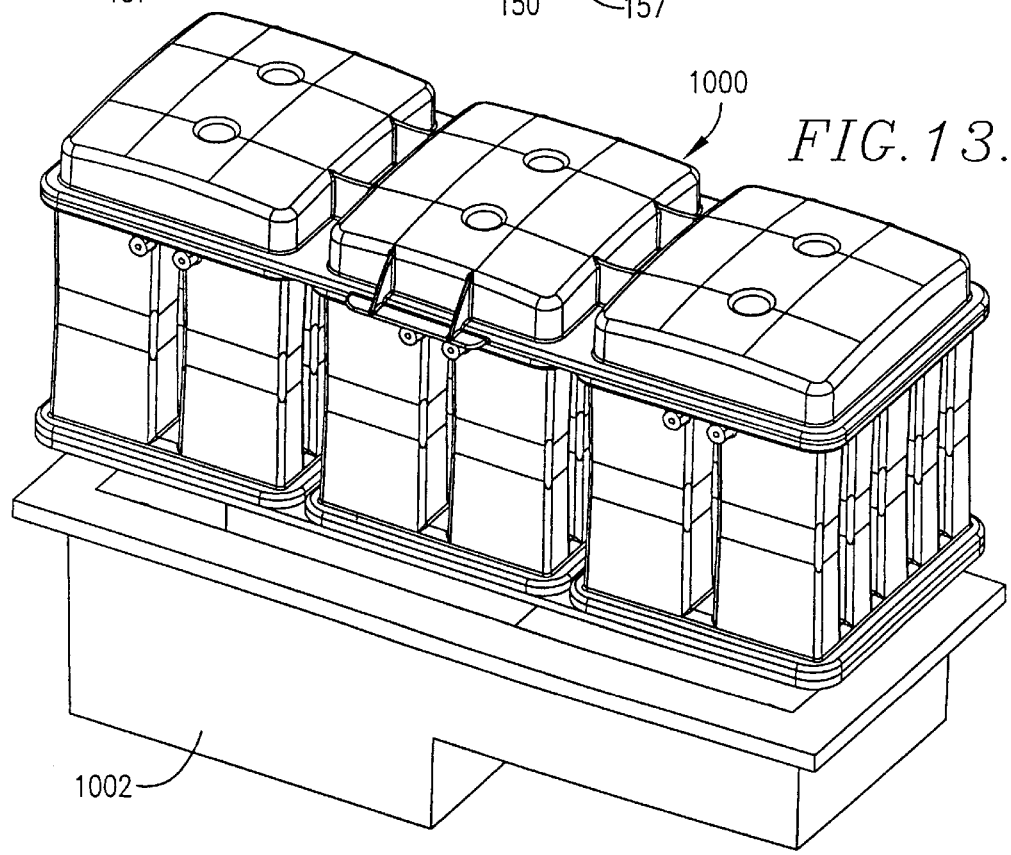
FIG. 13 is an isometric view of a telecommunications enclosure constructed in accordance with a third preferred embodiment of the present invention.

FIG. 13 illustrates a third preferred embodiment of the present invention. The upper portion 1000 of FIG. 13 illustrates the enclosure fitted for an existing industry standard splice box such as the Western Electric 819 case 1002.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

What is claimed is:

1. An enclosure for protecting a plurality of electronic cards from exposure to harmful elements and for dissipating internally-generated heat, the enclosure comprising:

a plurality of sleeves, with each of the sleeves being configured for receiving and enclosing a number of the electronic cards which is less than all of the electronic cards, wherein each of the sleeves is directly exposed to an ambient environment which is external to the enclosure, and each of the sleeves is spaced apart from the remainder of the sleeves so as to create a plurality of open air channels between the sleeves and substantially surrounding each of the sleeves so as to facilitate dissipating heat generated within the sleeves.

2. The enclosure as set forth in claim 1, wherein each of the sleeves is configured for receiving and enclosing no more than one of the electronic cards.

3. The enclosure as set forth in claim 2, wherein one or more of the electronic cards is a double-wide electronic card.

4. The enclosure as set forth in claim 1, further including a plurality of removable protection cards, wherein each of the protection cards is associated with one or more of the electronic cards.

5. An enclosure for protecting a plurality of electronic cards from exposure to harmful elements and for dissipating internally-generated heat, the enclosure comprising:

a plurality of sleeves, with each of the sleeves being configured for receiving and enclosing a number of the electronic cards which is less than all of the electronic cards, wherein each of the sleeves is directly exposed to an ambient environment which is external to the enclosure, and each of the sleeves is spaced apart from the remainder of the sleeves so as to create a plurality of open air channels between the sleeves and substantially surrounding each of the sleeves so as to facilitate dissipating heat generated within the sleeves;

a plurality of removable protection cards, wherein each of the protection cards is associated with one or more of the electronic cards; and at least one chamber operable to receive one or more of the protection cards, with the protection cards being removable from the chamber without removing the one or more associated electronic cards.

6. The enclosure as set forth in claim 5, wherein each of the sleeves is configured for receiving and enclosing no more than one of the electronic cards.

7. The enclosure as set forth in claim 5, wherein one or more of the electronic cards is a double-wide electronic card.

8. An enclosure for protecting a plurality of electronic cards from exposure to harmful elements and for dissipating internally-generated heat, the enclosure comprising:

a plurality of sleeves, with each of the sleeves being configured for receiving and enclosing no more than one of the electronic cards, wherein each of the sleeves is directly exposed to an ambient environment which is external to the enclosure, and each of the sleeves is spaced apart from the remainder of the sleeves so as to create a plurality of open air channels between the sleeves and substantially surrounding each of the sleeves so as to facilitate dissipating heat generated within the sleeves.

9. The enclosure as set forth in claim 8, wherein one or more of the electronic cards is a double-wide electronic card.

10. The enclosure as set forth in claim 8, further including a plurality of removable protection cards, wherein each of the protection cards is associated with one or more of the electronic cards.

11. The enclosure as set forth in claim 10, further including at least one chamber operable to receive one or more of the protection cards, with the protection cards being removable from the chamber without removing the one or more associated electronic cards.

* * * * *